US009912074B2

(12) United States Patent
Ray (10) Patent No.: US 9,912,074 B2
(45) Date of Patent: Mar. 6, 2018

(54) CONGRUENT NON-UNIFORM ANTENNA ARRAYS

(71) Applicant: THE BOEING COMPANY, Chicago, IL (US)

(72) Inventor: Gary Ray, Chicago, IL (US)

(73) Assignee: The Boeing Company, Chicago, IL (US)

( * ) Notice: Subject to any disclaimer, the term of this patent is extended or adjusted under 35 U.S.C. 154(b) by 535 days.

(21) Appl. No.: 14/569,413

(22) Filed: Dec. 12, 2014

(65) Prior Publication Data

US 2016/0172767 A1    Jun. 16, 2016

(51) Int. Cl.
*H01Q 21/08* (2006.01)
*H01Q 21/00* (2006.01)
*G01S 3/46* (2006.01)
*H01Q 3/26* (2006.01)
*H01Q 21/22* (2006.01)
*G06F 17/50* (2006.01)

(52) U.S. Cl.
CPC ......... *H01Q 21/0087* (2013.01); *G01S 3/46* (2013.01); *G06F 17/5063* (2013.01); *H01Q 3/26* (2013.01); *H01Q 21/08* (2013.01); *H01Q 21/22* (2013.01); *Y02T 10/82* (2013.01)

(58) Field of Classification Search
CPC ....... H01Q 21/0087; H01Q 21/08; G01S 3/46
See application file for complete search history.

(56) References Cited

PUBLICATIONS

Zaman et al. ("Nonuniformly Spaced Linear Antenna Array Design Using Firefly Algorithm"), International Journal of Microwave Science and Technology. vol. 2012, 8 pages.*
Weng et al. ("A Search-free DOA Estimation Algorithm for Coprime Arrays"), Dec. 2014, pp. 1-22.*
Hodjat et al ("Nonuniformly Spaced Linear and Planar Array Antennas for Sidelobe Reduction"), IEEE Tran. on Antennas and Propagation vol. AP-26, Mar. 1978, pp. 198-204.*
Skolnik, "Radar Handbook", McGraw-Hill, Second Edition, Chapter 7, Section 7.3 Planar Arrays and Beam Steering, 1990.

* cited by examiner

*Primary Examiner* — Gregory C. Issing
(74) *Attorney, Agent, or Firm* — Haynes and Boone, LLP (57) ABSTRACT

Systems, methods, and apparatus for forming an antenna array are disclosed. In one or more embodiments, the disclosed method involves determining at least one coprime moduli set based upon a differential phase gain requirement and a differential phase range requirement for the antenna array. The method further involves producing at least one configuration for relative spacing of antenna elements of the antenna array by using at least one coprime moduli set. Also, the method involves choosing one of configurations for the antenna array to employ by evaluating a resultant gain and an unambiguous angle of arrival (AOA) for each of the configurations. Further, the method involves determining the absolute spacing of the antenna elements of the antenna array for the chosen configuration for the antenna array according to a wavelength requirement for the antenna array.

20 Claims, 8 Drawing Sheets

FIG. 1A —PRIOR ART—

FIG. 1B $$s = \sum_i s_i N_i = \sum_i s_i \left( \frac{p}{p_i} \left[ \left( \frac{p}{p_i} \right) \right]_{p_i}^{-1} \right) \quad \text{EQUATION 1}$$

$$N_j/(P/p_j) = b_j = \left[ \left( \frac{p}{p_j} \right) \right]_{p_j}^{-1}, \quad \text{EQUATION 2}$$

$$s \bmod 1 = \sum_i s_i b_i = A_b(s) \quad \text{EQUATION 3}$$

$$b_j = \left[ \left( \frac{p}{p_j} \right) \right]_{p_j}^{-1} \bmod p_j \quad \text{EQUATION 4}$$

| Congruent Structure | Calculating Spacing | Gain | Minimum Unambiguous Wavelength | Minimum Diameter | Minimum Unambiguous Wavelength | Unambiguous Phase Range Gain |
|---|---|---|---|---|---|---|
| [2,3,5,7] | $\frac{\lambda_d}{2}, \frac{\lambda_d}{3}, \frac{\lambda_d}{5}, \frac{\lambda_d}{7}$ | 0.7 (db) | $\frac{\lambda_d}{15}$ | $\frac{\lambda_d}{2}$ | $\frac{\lambda_d}{7}$ | 7.5 |
| [2,3,5,7] | $\frac{\lambda_d}{2}, \frac{\lambda_d}{3}, \frac{\lambda_d}{5}, \frac{\lambda_d}{7}$ | 0.7 (db) | $\frac{\lambda_d}{15}$ | $\frac{\lambda_d}{2}$ | $\frac{\lambda_d}{7}$ | 8 |
| [2,3,5,7] | $\frac{\lambda_d}{2}, \frac{\lambda_d}{3}, \frac{\lambda_d}{5}, \frac{\lambda_d}{7}$ | 0.7 (db) | $\frac{\lambda_d}{15}$ | $\frac{\lambda_d}{2}$ | $\frac{\lambda_d}{7}$ | 8 |
| [2,3,5,7] | $\frac{\lambda_d}{2}, \frac{\lambda_d}{3}, \frac{\lambda_d}{5}, \frac{\lambda_d}{7}$ | 0.4 (db) | $\frac{\lambda_d}{21}$ | $\frac{\lambda_d}{2}$ | $\frac{\lambda_d}{7}$ | 10 |
| [2,3,5,7] | $\frac{\lambda_d}{2}, \frac{\lambda_d}{3}, \frac{\lambda_d}{5}, \frac{\lambda_d}{7}$ | 0.4 (db) | $\frac{\lambda_d}{21}$ | $\frac{\lambda_d}{2}$ | $\frac{\lambda_d}{7}$ | 10 |
| [2,3,5,7] | $\frac{\lambda_d}{2}, \frac{\lambda_d}{3}, \frac{\lambda_d}{5}, \frac{\lambda_d}{7}$ | 1.8 (db) | $\frac{\lambda_d}{21}$ | $\frac{\lambda_d}{2}$ | $\frac{\lambda_d}{7}$ | 10.5 |
| [2,3,5,7,11] | $\frac{\lambda_d}{2}, \frac{\lambda_d}{3}, \frac{\lambda_d}{5}, \frac{\lambda_d}{7}, \frac{\lambda_d}{11}$ | 1.8 (db) | $\frac{\lambda_d}{105}$ | $\frac{\lambda_d}{2}$ | $\frac{\lambda_d}{11}$ | 52.5 |
| [2,3,5,7,11,13,17] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}$ | 4.1 (db) | $\frac{\lambda_d}{1105}$ | $\frac{\lambda_d}{2}$ | $\frac{\lambda_d}{17}$ | 552.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 7.3 (db) | $\frac{\lambda_d}{1615}$ | $\frac{\lambda_d}{2}$ | $\frac{\lambda_d}{19}$ | 807.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 2.4 (db) | $\frac{\lambda_d}{2145}$ | $\frac{\lambda_d}{2}$ | $\frac{\lambda_d}{19}$ | 1072.5 |
| [2,3,5,7,11,13] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}$ | 1.4 (db) | $\frac{\lambda_d}{2145}$ | $\frac{\lambda_d}{2}$ | $\frac{\lambda_d}{13}$ | 1072.5 |
| [2,3,5,7,11,13,17] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}$ | 2.5 (db) | $\frac{\lambda_d}{2431}$ | $\frac{\lambda_d}{2}$ | $\frac{\lambda_d}{17}$ | 1215.5 |
| [2,3,5,7,11,13,17] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}$ | 0.6 (db) | $\frac{\lambda_d}{3315}$ | $\frac{\lambda_d}{2}$ | $\frac{\lambda_d}{17}$ | 1657.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 2.2 (db) | $\frac{\lambda_d}{3705}$ | $\frac{\lambda_d}{2}$ | $\frac{\lambda_d}{19}$ | 1852.5 |
| [2,3,5,7,11,13,17] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}$ | 1.1 (db) | $\frac{\lambda_d}{4641}$ | $\frac{\lambda_d}{2}$ | $\frac{\lambda_d}{17}$ | 2320.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 1.1 (db) | $\frac{\lambda_d}{5187}$ | $\frac{\lambda_d}{2}$ | $\frac{\lambda_d}{19}$ | 2593.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 2.4 (db) | $\frac{\lambda_d}{6545}$ | $\frac{\lambda_d}{2}$ | $\frac{\lambda_d}{19}$ | 3272.5 |
| [2,3,5,7,11,13,17] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}$ | 0.9 (db) | $\frac{\lambda_d}{6545}$ | $\frac{\lambda_d}{2}$ | $\frac{\lambda_d}{17}$ | 3272.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 0.0 (db) | $\frac{\lambda_d}{7735}$ | $\frac{\lambda_d}{2}$ | $\frac{\lambda_d}{19}$ | 3867.5 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 0.3 (db) | $\frac{\lambda_d}{8398}$ | $\frac{\lambda_d}{2}$ | $\frac{\lambda_d}{19}$ | 4199 |
| [2,3,5,7,11,13,17,19] | $\frac{\lambda_d}{2}, \frac{\lambda_d}{3}, \frac{\lambda_d}{5}, \frac{\lambda_d}{7}, \frac{\lambda_d}{11}, \frac{\lambda_d}{13}, \frac{\lambda_d}{17}, \frac{\lambda_d}{19}$ | 2.3 (db) | $\frac{\lambda_d}{17765}$ | $\frac{\lambda_d}{2}$ | $\frac{\lambda_d}{19}$ | 8882.5 |

CONGRUENT NON-UNIFORM ANTENNA ARRAYS

FIELD

The present disclosure relates to antenna arrays. In particular, it relates to congruent non-uniform linear receive and transmit antenna arrays.

BACKGROUND

As the applications for higher frequency RF increases in areas such as biomedical imaging, automotive anti-collision radars, electronic warfare, and communications, the desire for antenna arrays supporting these applications is also increasing. Antenna arrays allow greater antenna gain and directionality for many different beam forming applications. To meet these higher frequency applications, better antenna receive and transmit structures are required to handle the problems inherent in the conventional uniform linear antenna array for these applications. For example, each receive antenna element must have an electronic backend as near as possible to the antenna element for amplification, conditioning, phase matching, calibration and phase control. However, these modules tend to be much larger than the antenna element spacing. This spacing is driven by the requirement to eliminate grating lobes. In this case, arrays must have the required less than (<) $\lambda/2$ spacing for radio frequency (RF) frequency f with wavelength $\lambda = c/f$, where c is equal to the velocity of light. As such, there is a need for a solution for an improved antenna array that employs wider spacing between the antenna elements, while preserving the unambiguous phase information necessary for array processing. Note that a fundamental principle of antenna systems (called reciprocity) states that radiation and receiving patterns are identical, meaning that all of what we describe associated with received signals also applies to transmitted signals.

SUMMARY

The present disclosure relates to a method, system, and apparatus for congruent non-uniform linear receive and/or transmit antenna arrays. In one or more embodiments, a method for forming an antenna array involves determining, with at least one processor, at least one coprime moduli set based upon a differential phase gain requirement and a differential phase range requirement for the antenna array. The method further involves producing, with at least one processor, at least one configuration for the relative spacing of the antenna elements of the antenna array by using at least one coprime moduli set. Also, the method involves choosing, with at least one processor, one of the configurations for the antenna array to employ by evaluating a resultant gain and an unambiguous angle of arrival (AOA) for each of the configurations. In addition, the method involves determining, with at least one processor, absolute spacing of the antenna elements of the antenna array for the chosen configuration for the antenna array according to a wavelength requirement for the antenna array.

In one or more embodiments, the antenna array is a linear array. In some embodiments, the antenna array is a planar array or other more general type of array.

In at least one embodiment, the antenna elements are receive elements. In one or more embodiments, the antenna elements are transmit elements. In some embodiments, the antenna elements are transmit and receive elements.

In one or more embodiments, the absolute spacing between the antenna elements is equal to or greater than the wavelength requirement divided by two.

In at least one embodiment, at least one coprime moduli set is determined by using a Chinese Remainder Theorem.

In one or more embodiments, a system for forming an antenna array, the system involves the antenna array comprising a plurality of antenna elements. The system further involves at least one processor to determine at least one coprime moduli set based upon a differential phase gain requirement and a differential phase range requirement for the antenna array, to produce at least one configuration for relative spacing of the antenna elements of the antenna array using at least one coprime moduli set, to choose one of the configurations for the antenna array to employ by evaluating a resultant gain and unambiguous angle of arrival (AOA) for each of the configurations, and to determine absolute spacing of the antenna elements of the antenna array for the chosen configuration for the antenna array according to a wavelength requirement for the antenna array.

In at least one embodiment, an apparatus for forming an antenna array, the apparatus involves the antenna array comprising a plurality of antenna elements. The system further involves at least one processor to determine at least one coprime moduli set based upon a differential phase gain requirement and a differential phase range requirement for the antenna array, to produce at least one configuration for relative spacing of the antenna elements of the antenna array using at least one coprime moduli set, to choose one of the configurations for the antenna array to employ by evaluating a resultant gain and unambiguous angle of arrival (AOA) for each of the configurations, and to determine absolute spacing of the antenna elements of the antenna array for the chosen configuration for the antenna array according to a wavelength requirement for the antenna array.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein provide an operative system for congruent non-uniform linear receive and/or transmit antenna arrays. The disclosed system allows for wider spacing between the antenna elements of the antenna array, while preserving the unambiguous phase information necessary for array processing. This means that a much wider bandwidth is possible with unambiguous angle of arrival (AOA) estimation. The system also allows for trade-offs between array gain and grating lobe formation, and allows for much smaller length arrays to be used for unambiguous wide-band AOA estimation. In addition, the system makes possible complex beam forming applications at higher frequencies than was possible before.

Currently, existing uniform linear array solutions for wide-band direction-finding applications require multiple arrays with different element spacings to handle the grating lobe problem. This is a non-optimal solution that requires multiple array design efforts together with much more physical space necessary for mounting and using these arrays. Physical space is at a premium on most airborne platforms, as well as most other applications.

The present disclosure is able to overcome previous drawbacks of existing uniform linear array antenna systems through the following main features. The first main feature is that the system allows for much wider bandwidth with unambiguous angle of arrival (AOA) estimation. The second main feature is that the system allows for trade-offs between array gain and grating lobe formation. The third main feature is that the system allows for much smaller length arrays to be used for unambiguous wide-band AOA estimation. And, the fourth main feature is that complex beam forming applications become possible at higher frequencies. These features provide many benefits directly to applications such as biomedical imaging, automotive anti-collision radars, electronic warfare, and communications.

Array Thinning

One of the methods currently used to create non-uniform phased arrays is known as array thinning. A large uniformly spaced array (either linear or planar) is used as a starting point. Large arrays are complex to build, have increased fabrication and setup costs, are heavier, etc; therefore, eliminating antenna elements from the array would be desirable, particularly if the array's performance is not significantly degraded. One method of achieving this goal is array thinning, which involves systematically removing elements without a large degradation in performance. The elements can then be perturbed (i.e. adjusted) from their locations if necessary. Array thinning will reduce the number of antenna elements and, hence, reduce the peak gain of the array. The goal is to keep the array gain acceptable. In addition, the sidelobe level and beamwidth are also degraded, but the thinning process will try and keep these array properties acceptable. Typically, the performance of the full uniform array can be approximately achieved using forty percent (40%) fewer elements. There are a number of techniques to design thinned arrays. These techniques include: (1) thinning based on empirical or analytical formula, (2) thinning based on space or density tapering, (3) statistically thinned arrays, and (4) optimizing algorithms. These techniques to design thinned arrays are described below.

For the thinning based on empirical or analytical formula techniques, array thinning can be performed by using an analytic formula or mathematical construct, which is advantageous because it does not require extensive trial and error computation. For example, array spacing can be designed to follow a prime number sequence, which leads to a non-uniform and sparse spacing such as given in the formula: $d=[2\lambda/2, 3\lambda/2, 5\lambda/2, 7\lambda/2, 11\lambda/2, \ldots]$. This type of array can be used for extending ranging estimates. While it has a superficial similarity to the arrays in this invention disclosure, the arrays discussed in what follows are much different in character and usage.

For the thinning based on space or density tapering technique, a successful method of lowering sidelobes in arrays is to decrease the magnitude of the weights away from the center of the array. This tapering is similar to "windowing" in digital signal processing. Having a uniform weight set across the array leads to higher sidelobes than when the weights taper down, in general. The density tapering approach uses uniform weights for all antennas; however, it removes antenna elements away from the center, in effect having less energy radiated away from the center of the array, which accomplishes the same effect as state above.

For the statistically thinned arrays technique, for very large arrays, a statistical method is often used for array tapering. In this approach, the probability for an element to lie in a particular position is proportional to the desired weighting for a weight-tapered array. For arrays with a large number of elements, this approach yields arrays that behave properly and have low sidelobes.

For the optimizing algorithms technique, thinning and placement optimization is often done via optimization algorithms. Examples include: Genetic Algorithms (GA), the Particle Swarm Optimization (PSO) algorithm, and Simulated Annealing (SA).

All of these methods employ some statistical optimization approach that guesses at the proper elements to remove, then removes them if this increases the performance of the array. The concept of array thinning has been popular in the antenna literature, primarily because it is simple to implement and can achieve interesting results. By contrast, the present disclosure describes a new way to create a non-uniform array with given array gain and unambiguous phase using a controlled design process.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with, and that the system described herein is merely one example embodiment of the present disclosure.

For the sake of brevity, conventional techniques and components related to antenna arrays, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Parts of the Present Disclosure

The present disclosure consists of three main parts. The first main part is a non-uniform linear array design with wider spacing of elements than required by the traditional $\lambda/2$ requirements. This design magnifies the unambiguous phase range of the array over other uniform and non-uniform array designs. This means that much wider bandwidth is possible for unambiguous angle of arrival (AOA) estimation. The second main part is a processing method that enables unambiguous array phase measurements and, hence, unambiguous phased array signal processing from design antenna phase locations. The third main part is a design methodology that allows trade-offs between array gain, array diameter (e.g., length), and unambiguous phase range. The present disclosure makes possible complex beam forming applications at higher frequencies than was possible before for practical array configurations.

Congruent Non-Uniform Linear Arrays

The spacing of a congruent array is defined by a length n coprime moduli set which we denote by $\{p_i\}_{i=1,2,\ldots,n}$. The spacing of the congruent array is defined by a design wavelength $\lambda_d$ with pairwise element distances in the set $\{\lambda_d/p_1, \lambda_d/p_2, \ldots, \lambda_d/p_n\}$.

The choice of $\lambda_d$ is made during the array design process to be described in the Design Process Section below. The actual antenna element locations are chosen so that these pairwise distances are covered. One obvious method is to use n+1 elements arranged in a line with differences in position as given, but any other method of placement can be chosen. This implies that while there are n pair distances for a congruent array, there can be more or less than n+1 elements. This also implies that planar and more general array types can be created using our techniques. The phase differences of a signal are measured by the congruent array to produce a set of phase differences $\{s_i\}$. The disclosed processing method uses these measured phase differences to extend the unambiguous phase measurement to a larger range and allows us to trade off the noise performance with the unambiguous phase range.

Figure 1A:
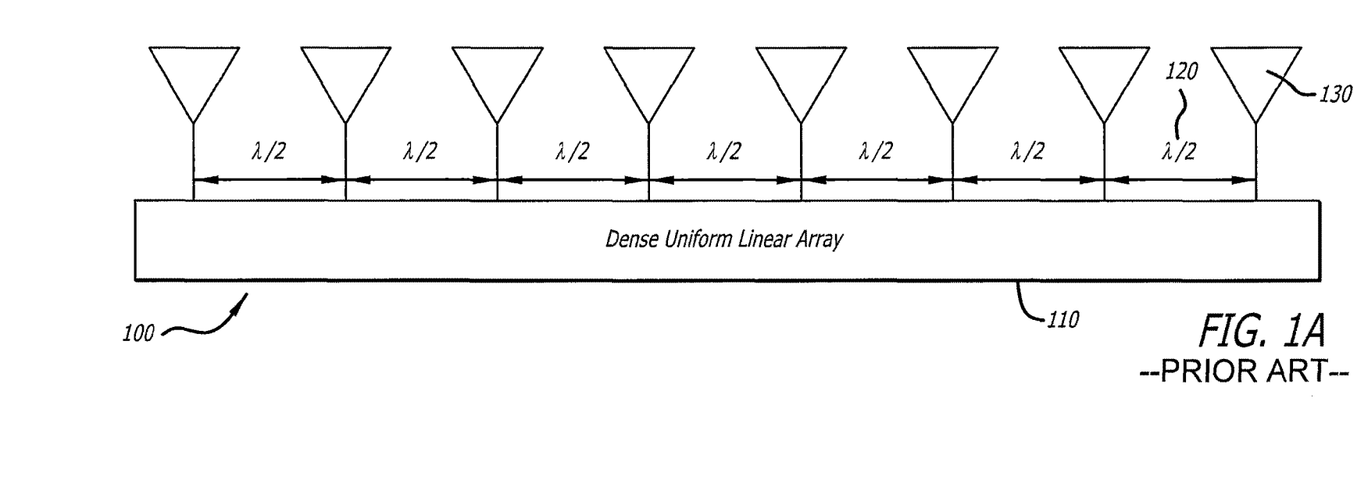
FIG. 1A is a diagram showing an exemplary conventional, dense uniform, linear antenna array with dense uniform spacing between the antenna elements.
Figure 1B:
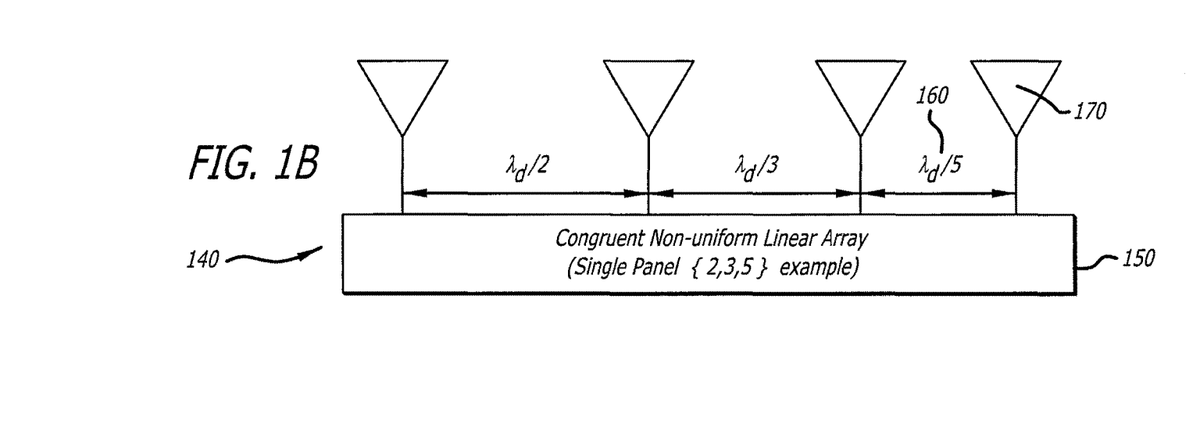
FIG. 1B is a diagram illustrating an exemplary disclosed congruent non-uniform linear array with spread-out non-uniform spacing between the antenna elements, in accordance with at least one embodiment of the present disclosure.

FIG. 1A is a diagram 100 showing an exemplary conventional, dense uniform, linear antenna array 110 with dense uniform spacing 120 (i.e. $\lambda/2$) between the antenna elements 130. FIG. 1B is a diagram 140 illustrating an exemplary disclosed congruent non-uniform linear array 150 with spread-out non-uniform spacing 160 (i.e. $\lambda_d/2$, $\lambda_d/3$, $\lambda_d/5$) between the antenna elements 170, in accordance with at least one embodiment of the present disclosure. In one or more embodiments, the antenna array 150 may be a linear array, as shown in FIG. 1B, or may be a planar array. Also, in at least one embodiment, the antenna elements 170 may be receive elements, transmit elements, or transmit and receive elements. In one or more embodiments, the spacing 160 (i.e. absolute spacing) between the antenna elements 170 is $\geq \lambda/2$ (i.e. the wavelength requirement divided by 2).

Processing of Congruent Arrays

Consider the congruent system with unknown s and a set of coprime moduli $\{p_i\}$:

$$s = s_1 \bmod p_1$$
$$s = s_2 \bmod p_2$$
$$\ldots$$
$$s = s_n \bmod p_n$$

Figure 2:
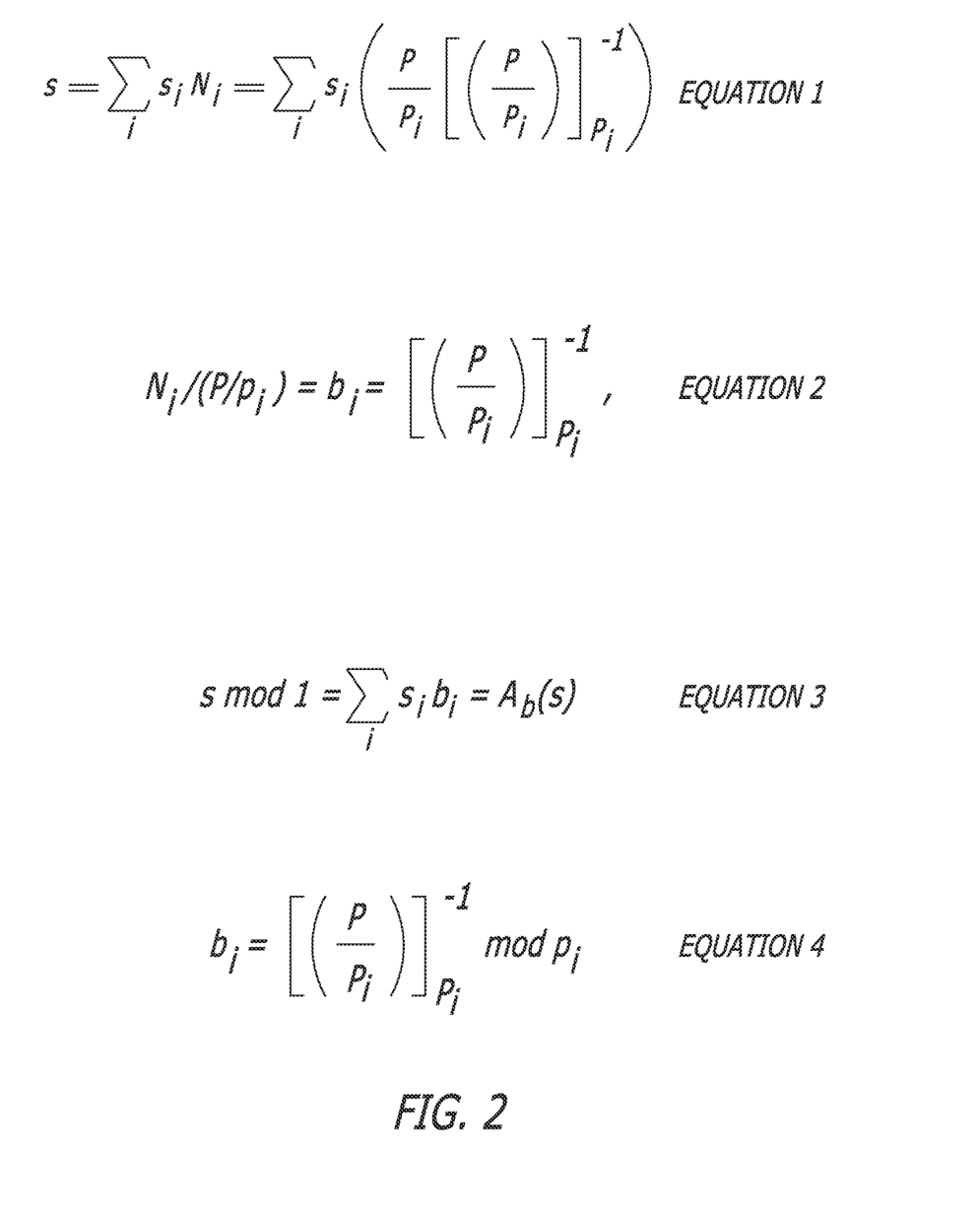
FIG. 2 contains related formulas for the disclosed processing for congruent non-uniform linear antenna arrays, in accordance with at least one embodiment of the present disclosure.

This system has a solution from the Chinese Remainder Theorem as follows. FIG. 2 contains related formulas for the disclosed processing of congruent non-uniform linear antenna arrays. Let $P = p_1 p_2 \ldots p_n$ be the product of every modulus, then Equation 1 (refer to FIG. 2) satisfies the system of congruences, where each inverse is taken modulo $p_i$. This fact will be used in the design of congruent non-uniform linear arrays with the benefits we have outlined before. Suppose we have a given design parameter $\lambda_d$ representing the wavelength design parameter for a congruent linear array. Note that this is necessarily different from the incoming signal with, say, a wavelength of $\lambda$. Note also that this can also be different from the minimum unambiguous wavelength supported by the design. The differential spacing of the array element pairs is:

$$\{\lambda_d/p_1, \lambda_d/p_2, \ldots, \lambda_d/p_n\}.$$

Figure 4A:
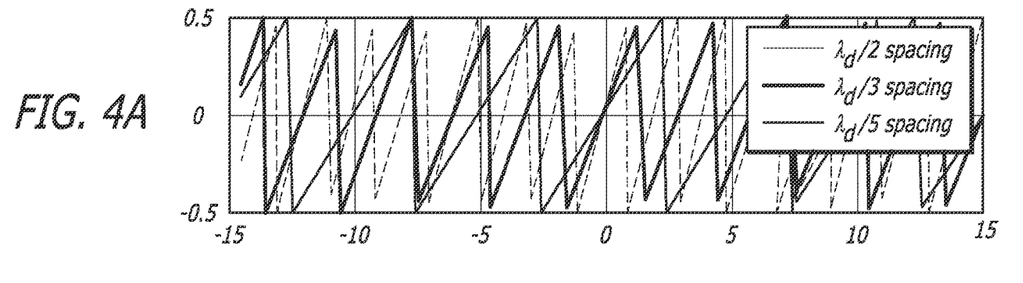
FIGS. 4A-4F are graphs illustrating the simulated performance for different processing options for the disclosed system for congruent non-uniform linear antenna arrays, in accordance with at least one embodiment of the present disclosure.

The processing for an incoming signal s with wavelength $\lambda$ is described in what follows using a very simple 3 moduli example illustration. Note that this process could also be described for transmission as well, but this is unnecessary due to the principle of antenna reciprocity. Each pair of virtual antenna elements is used to compute a phase difference of the incoming signal at those two elements. This phase difference for the $i^{th}$ pair is equal to:

$$s_i = (s/p_i) \bmod 1,$$

where we normalize the phase range to lie between $-\frac{1}{2}$ and $\frac{1}{2}$, instead of $-\pi$ to $\pi$, hence we compute modulo 1 in this equation. This phase will be used in the same manner as the congruence values above. FIG. 4A shows these phases for the prime moduli set $\{2,3,5\}$. The first step is to center lift this modulus so that it lies between $-\frac{1}{2}$ and $\frac{1}{2}$. This is done by adding 0 or $\pm 1$ to reduce the modulus to this range. The next step is to take the Chinese Remainder result from the previous section and apply to these signal phases.

Since Equation 2 (refer to FIG. 2) it follows that Equation 3 (refer to FIG. 2), where $A_b(s)$ is defined as this modulo operation on the inner product of b and s. This operation unwraps the received phases to produce an unwrapped phase with a greater valid range. Note that either positive or negative values of $b_i$ (refer to Equation 4 of FIG. 2) will give the same answer after unwrapping. However, the noise performance is different. By choosing the best choice of signs for all elements of the vector $b = (b_1, b_2, \ldots, b_n)$ for which the norm $\|b_1, b_2, \ldots, b_n\|$ is minimal, this gives the best noise performance for this particular unwrapping operation. This is again done by a center lift, choosing $-p_i/2 < b_i < p_i/2$. It should be noted that in Equation 4, the bracket notation represents modulo p, and the bracket notation with a superscript −1 represents the inverse modulo p.

Figure 3:
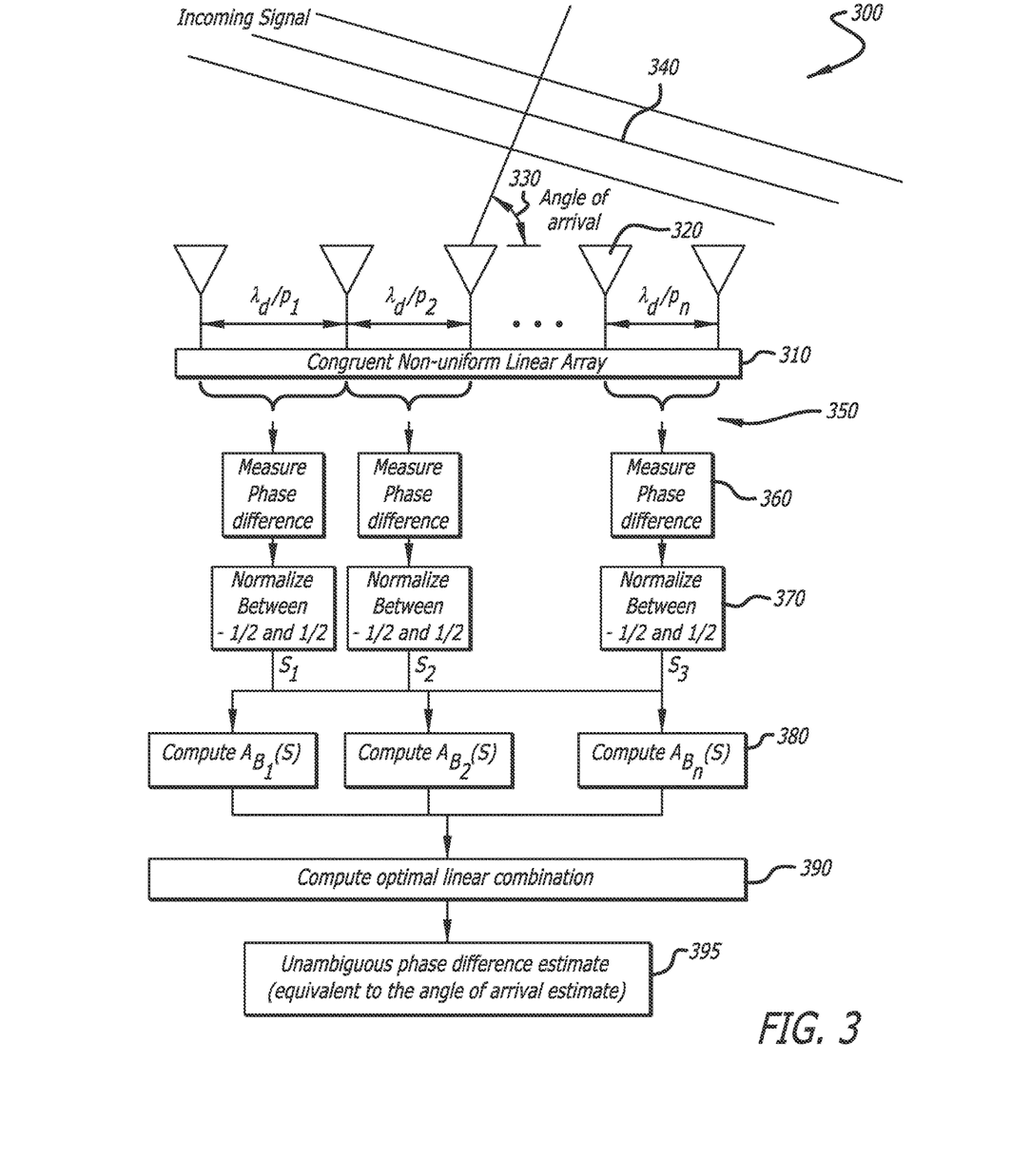
FIG. 3 is a diagram showing the disclosed processing for congruent non-uniform linear antenna arrays, in accordance with at least one embodiment of the present disclosure.

FIG. 3 shows this processing methodology as described above. In particular, FIG. 3 is a diagram 300 showing the disclosed processing for congruent non-uniform linear antenna arrays, in accordance with at least one embodiment of the present disclosure. In this figure, each differential antenna element 320 of a linear antenna array 310 sees a common phase difference related to the angle of arrival 330 of the incoming signal 340. The antenna elements 320 are shown to be spaced by $\{\lambda_d/p_1, \lambda_d/p_2, \ldots, \lambda_d/p_n\}$. The antenna elements 320 are paired 350 up for computing the phase difference.

Then, the phase difference of each of the pairs 350 of the antenna elements 320 is measured 360. The phase range is normalized between −½ and ½ 370. Then, $A_{Bn}(s)$ is computed 380 for each of the pairs 350 of the antenna elements 320. The optimal linear combination is computed 390. Then, an unambiguous phase difference estimate, which is equivalent to the angle of arrival estimate, is made 395.

FIG. 4 shows the results of applying this processing to various subsets of the coprime moduli set $\{2,3,5\}$. In particular, FIGS. 4A-4F are graphs illustrating the simulated performance for different processing options for the disclosed system for congruent non-uniform linear antenna arrays, in accordance with at least one embodiment of the present disclosure.

FIG. 4A shows the phase for each of the three phase differences $\{s_i\}$ over the entire phase range −15 to 15 which could be represented unambiguously if all three moduli are used. We have added Gaussian random phase noise to the data with standard deviation of 0.01 to show graphically the effects of the noise performance for the different processing methods described above. Note that the $\lambda_d/2$ spacing, the $\lambda_d/3$ spacing, and the $\lambda_d/5$ spacing lines show the phase wrapping that occurs for each modulus and, thus, show that the largest unambiguous phase range is the period of the largest modulus, for example −5/2 to 5/2 for modulus 5. To create a system with a larger unambiguous phase range requires combining moduli, as has been previously discussed. FIG. 4B-4F show examples of different combinations together with their noise sigma (i.e. standard deviation of phase error).

Figure 4B:
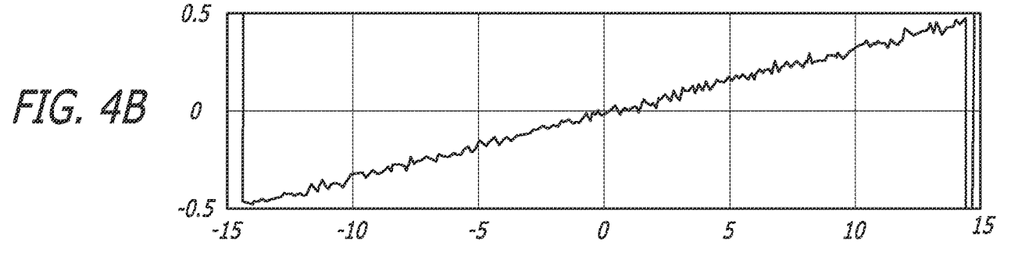

FIG. 4B shows the results of applying the algorithm to the same phase range −15 to 15 using all three moduli with $b=(-1_2, 1_3, 1_5)$, where we use this notation as a shorthand notation for the b vector for this particular moduli set. Notice that the phase noise for this method is 0.049, almost 5 times greater than the original phase noise (0.01) associated with the original signal reception at each antenna pair. What has been gained is that the valid phase range is extended from the original maximum range of −5/2 to 5/2 to the current −15 to 15 range, as shown in FIG. 4A, by a factor of 6. This illustrates the basic trade that can be performed, trading unambiguous phase range against noise performance. Also, note that phase modulo 1 folds at ±0.5, so in this figure, the phases near −0.5 are close to 0.5, so these errors are small even though the graph gives the appearance that the errors are large.

Figure 4C:
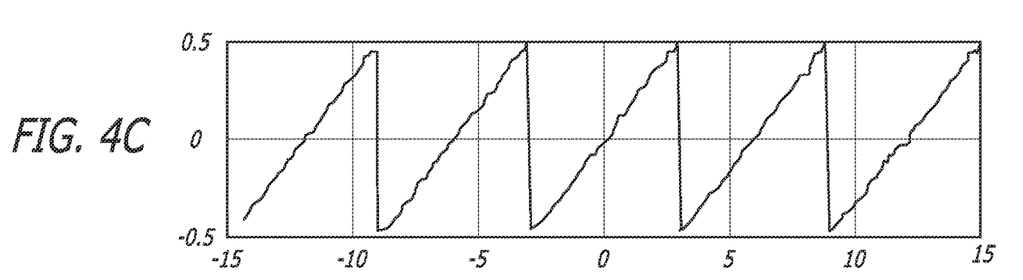

FIG. 4C shows the results of using moduli 2 and 3 with $b=(1_2, -1_3, 0_5)$ and gives the noise sigma of 0.014 with unambiguous phase range of −3 to 3, 6/5 times greater than the original range.

Figure 4D:
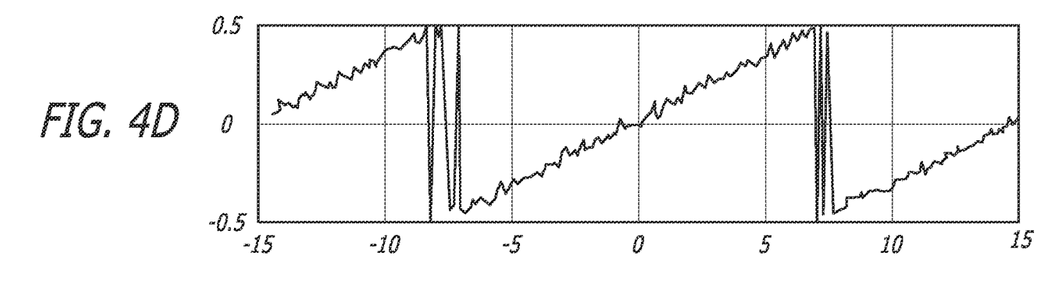

FIG. 4D shows the results of using moduli 3 and 5 with $b=(0_2, -1_3, 2_5)$ and gives the noise sigma of 0.036 with unambiguous phase range of −15/2 to 15/2, 3 times greater than the original range.

Figure 4E:
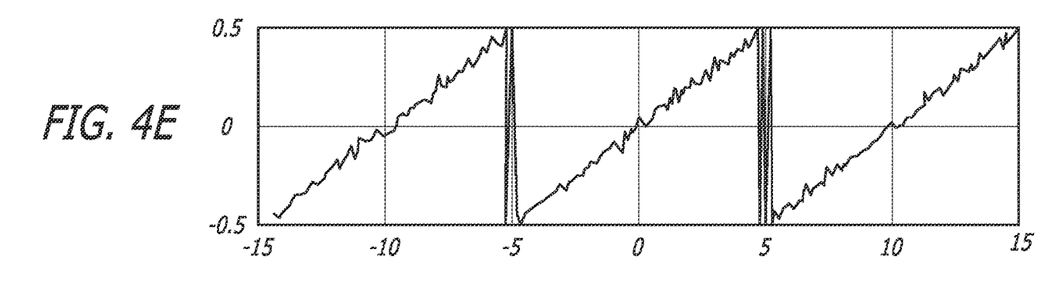

FIG. 4E shows the results of using moduli 2 and 5 with $b=(1_2, 0_3, -2_5)$ and gives the noise sigma of 0.023 with unambiguous phase range of −5 to 5, 2 times greater than the original range.

Figure 4F:
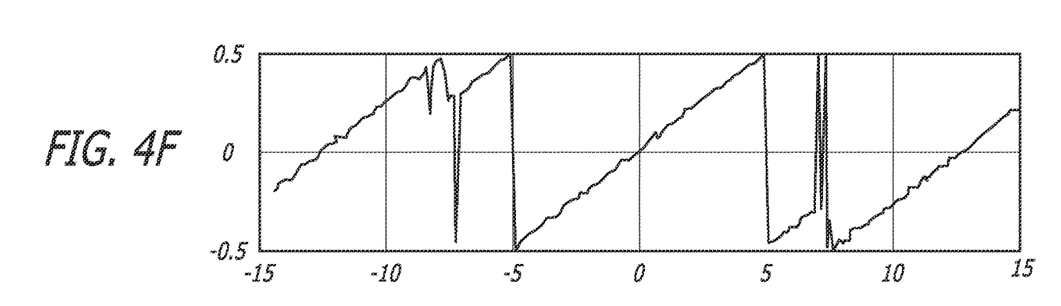

FIG. 4F shows the final step. The various combinations of these three options were evaluated and (for this particular illustration) a combination was chosen to create an optimized selection of subsets $\{P_J\}$ of $\{p_1, p_2, \ldots, p_n\}$ with associated optimized b vectors $\{B_J\}$. We chose the range −5 to 5 as the range to support; this means the wavelength range $\lambda_d/3$ is unambiguous. This means that only $B_1=(0_2, -1_3, 2_5)$ and $B_2=(1_2, 0_3, -2_5)$ meet this phase range. To average these, we must match their output ranges. This means that 5 must get mapped to 0.5 for both, leading to scalar gains of $3/2=(15/2)/5$ and 1 respectively. Our method gives the algorithm $(3/2A_{B_1}+A_{B_2})/2$ which is shown in FIG. 4F. Note that we have extended the unambiguous range with very little reduction in the signal to noise ratio from the original phase data. Since $\lambda_d$ must be chosen so that the unambiguous range $\leq \lambda_d/3$ must be $\leq \lambda/2$, it follows that $\lambda_d=3\lambda/2$ will work for the original problem, leading to the final differential spacing vector of $[3\lambda/2, 3\lambda/6, 3\lambda/10]$.

Figure 6:
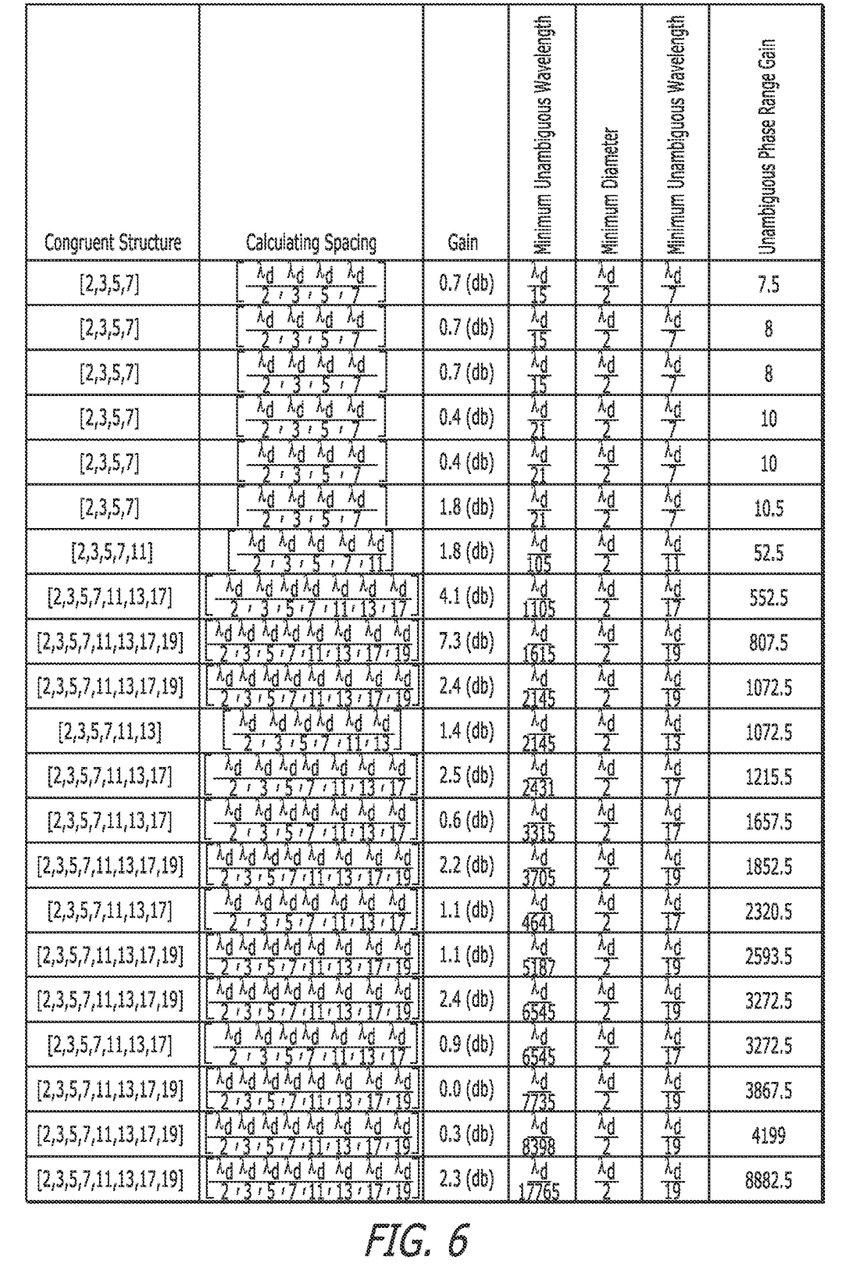
FIG. 6 is a table showing the simulation results for running an example design search for different moduli sets, sorted by the unambiguous phase range gain, in accordance with at least one embodiment of the present disclosure.

Note that the second and third entries are $\leq \lambda/2$, which may not be desired for element spacing, but this is simply the result of using too small of a moduli set for this simplistic example. For larger sets, we are able to produce arrays with minimal differential spacing that are all greater than $\lambda/2$ and still get the other benefits of larger ambiguous range, etc. Many examples are shown in the table of FIG. 6, where the minimum unambiguous wavelength is less than the minimum spacing. Because the noise performance was almost identical to a single phase difference in this simple example, the gain was essentially zero (0) decibels (dB). Note that an array with three elements measuring three differential phases, all with $\lambda/2$ spacing would have a gain of 10 $\log_{10}(3)=4.77$ dB, implying that the price we paid in this example for increased phase range is reduced gain from a standard array of three elements. In general, the disclosed method can nevertheless allow modest array gains, while at the same time greatly increasing the phase range (i.e. increasing the minimum array spacing while keeping the phase measurements unambiguous). Many examples of this are shown in the table of FIG. 6.

Design Process

In general, a full array is made of panels or subarrays because in these the inter-element distances can be tightly controlled during manufacturing. The full array performance is then computed from all the subarray performances. The following gives a general design process for the subarrays using our congruent non-uniform array approach. First, from the system and full array requirements, an overall desired subarray differential phase gain G is derived. This is the gain in signal to noise performance desired over a single antenna pair measuring one differential phase. Second, from the system and full array requirements, a maximum operating frequency f (in Hertz (Hz)) of the subarray is given with corresponding wavelength $c/\lambda$ where unambiguous differential phase measurements are required. Third, a search is performed over a large number of coprime moduli to produce the possible array configurations with corresponding array gain and acceptable phase range. The results of a short search example are shown in the Table of FIG. 6. Fourth, a choice is made from the table which meets the array gain (taken directly from the third column of the table), and $\lambda_d$ is chosen so that the minimum unambiguous wavelength is $\leq \lambda/2$ (taken from the fourth column of the table). And, fifth, from this choice, a receive algorithm results as the previous discussion shows, and an array spacing structure is given. Then antenna locations are chosen (by a designer or processor) on the subarray, which results in the given element spacing.

Figure 5:
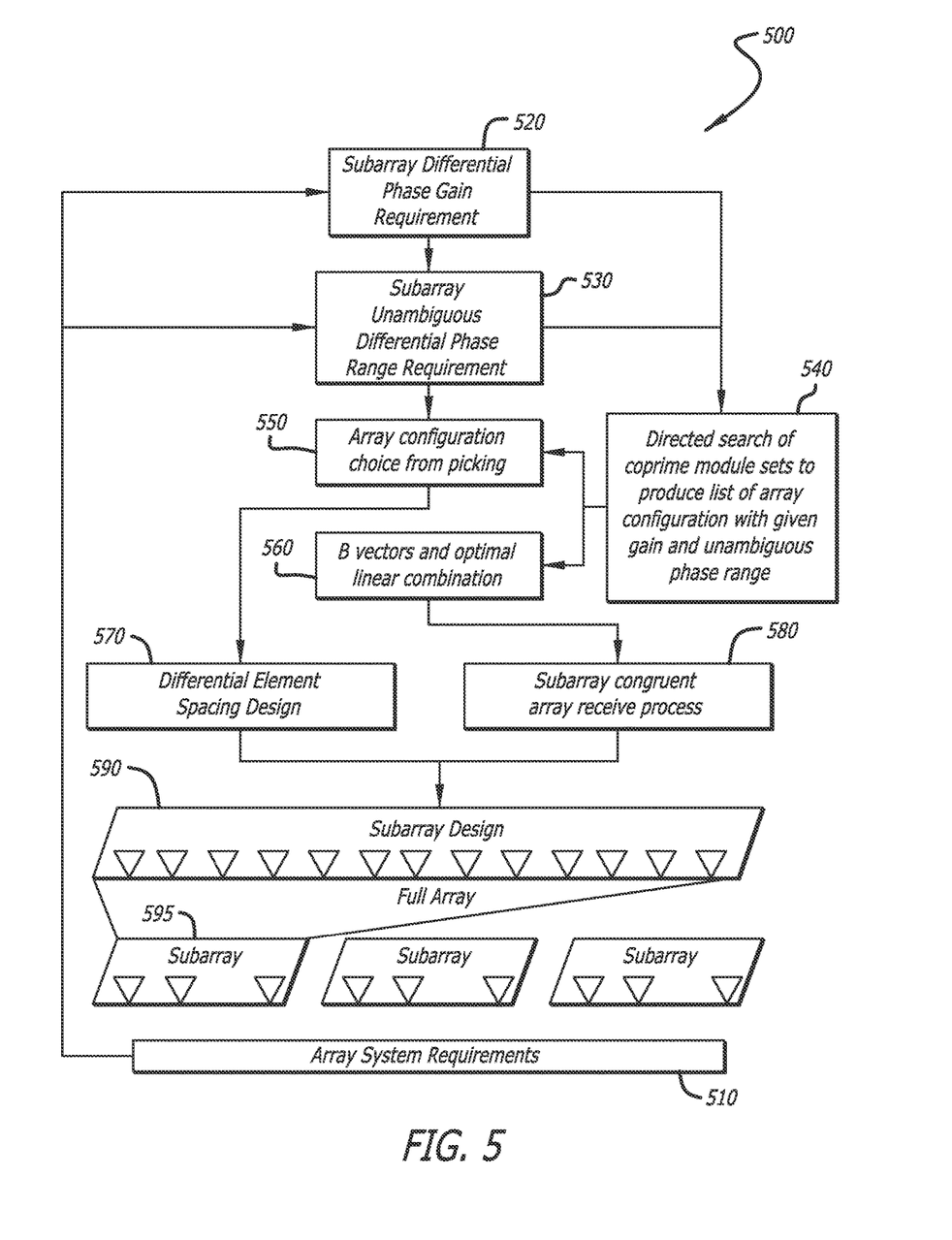
FIG. 5 depicts a block diagram depicting the disclosed design process for congruent non-uniform linear antenna arrays, in accordance with at least one embodiment of the present disclosure.

FIG. 5 shows the design process in a block diagram. In particular, FIG. 5 depicts a block diagram depicting the disclosed design process 500 for congruent non-uniform linear antenna arrays, in accordance with at least one embodiment of the present disclosure. At the start of the process, the array system requirements are determined 510. As such, the subarray differential phase gain requirement 520 and the subarray unambiguous differential phase range requirement 530 are determined. A directed search of coprime moduli sets is performed to produce a list of array configurations with given gain and unambiguous phase range 540. Then, an array configuration choice is made from picking $\lambda_d$ 550, and B vectors and an optimal linear combination are determined 560. The differential element spacing design is determined 570. The subarray congruent array receive process is performed 580. The initial subarray design with uniform spacing 590 is optimized to a subarray with non-uniform spacing 595. Then, the process 500 ends.

FIG. 6 is a table showing the simulation results for running an example design search for different moduli sets, sorted by the unambiguous phase range gain, in accordance with at least one embodiment of the present disclosure. Specifically, the table in FIG. 6 shows the results of running a search over several sets of coprime moduli, evaluating all the resulting array designs possible, and choosing those designs with positive gain, sorted by unambiguous phase range gain. Note that several possible subsets of the moduli with different b vectors are possible and give different results. These subsets and b vector values are not shown in the table, only the resulting gain and unambiguous phase range gain is shown.

Figure 7:
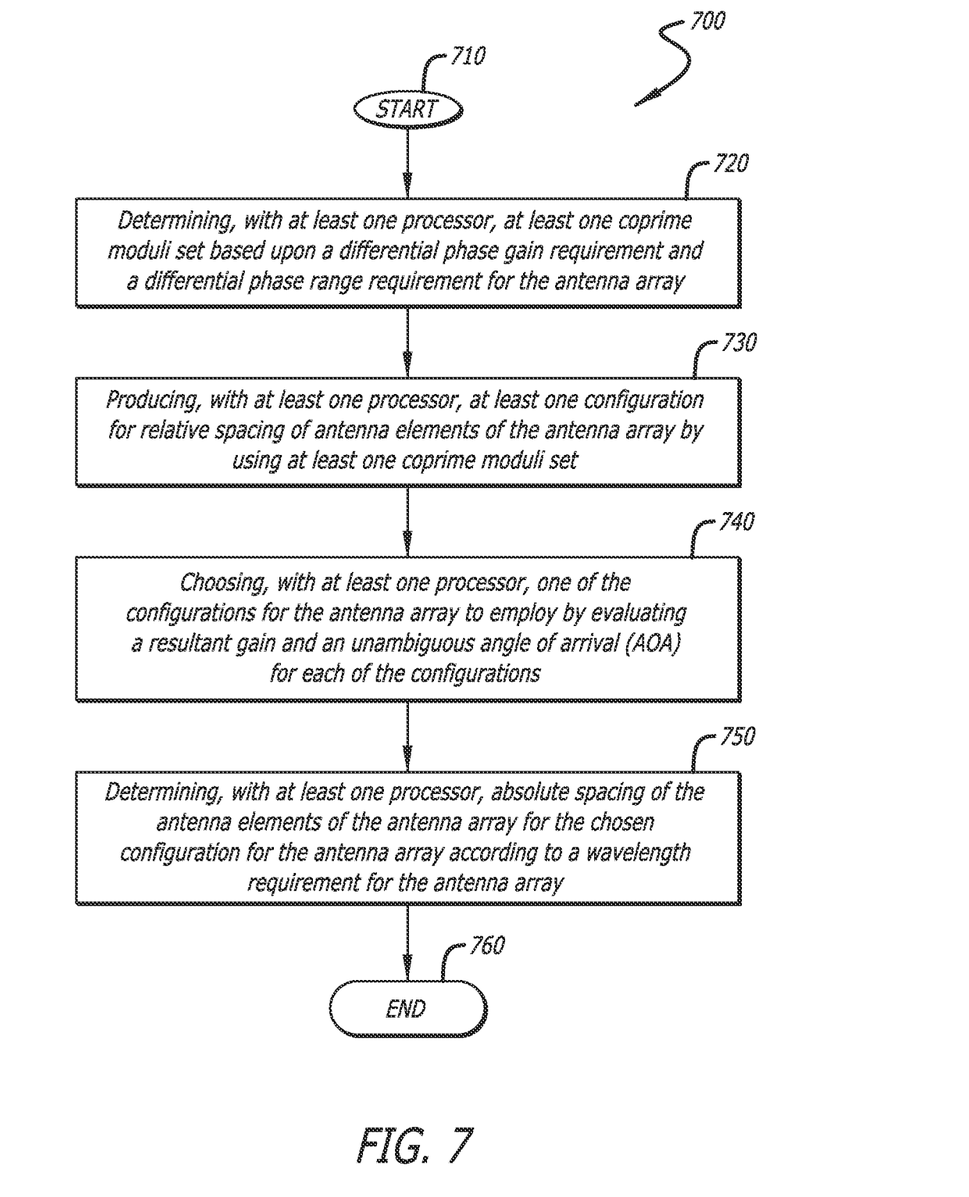
FIG. 7 depicts a flow chart depicting the disclosed method for congruent non-uniform linear antenna arrays, in accordance with at least one embodiment of the present disclosure.

FIG. 7 depicts a flow chart depicting the disclosed method 700 for congruent non-uniform linear antenna arrays, in accordance with at least one embodiment of the present disclosure. At the start 710 of the method 700, at least one processor determines at least one coprime moduli set based upon a differential phase gain requirement and a differential phase range requirement for the antenna array 720. Then, at least one processor produces at least one configuration for the relative spacing of the antenna elements of the antenna array by using at least one coprime moduli set 730. At least one processor then chooses one of the configurations for the antenna array to employ by evaluating a resultant gain and an unambiguous angle of arrival (AOA) for each of the configurations 740. Then, at least one processor determines absolute spacing of the antenna elements of the antenna array for the chosen configuration for the antenna array according to a wavelength requirement for the antenna array 750. Then, the method 700 ends 760.

SUMMARY

In summary, disclosed is a concept which creates an improved phased array element structure that solves several problems inherent with conventional uniform linear antenna arrays. The present disclosure allows for wider spacing of elements, while preserving the unambiguous phase information necessary for array processing. This means that much wider bandwidth is possible with unambiguous angle of arrival (AOA) estimation. It allows trade-offs between array gain and grating lobe formation and much smaller length arrays to be used for unambiguous wide-band AOA estimation. Finally, the disclosed method makes possible complex beam forming applications at higher frequencies than was possible before.

The present disclosure has the following advantageous features: (1) a processing method that enables unambiguous array phase measurements and, hence, provides unambiguous phased array signal processing from ambiguous antenna phase locations due to minimum $\lambda/2$ spacing violations; (2) a design methodology to create non-uniform linear antenna arrays with spacings that allow for gain in unambiguous frequency range; (3) a design methodology to create non-uniform linear antenna arrays with spacings that allow for much larger antenna modules for very high frequency applications and tilted antenna elements; and (4) a design methodology that allows for design tradeoffs between AOA accuracy, frequency range and element cost.

Although particular embodiments have been shown and described, it should be understood that the above discussion is not intended to limit the scope of these embodiments. While embodiments and variations of the many aspects of the present disclosure have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method for forming an antenna array, the method comprising:

determining, with at least one processor, at least one coprime moduli set $\{p_i\}$ based upon a differential phase gain requirement and a differential phase range requirement for the antenna array, wherein the antenna array comprises a plurality of antenna elements;

producing, with the at least one processor, at least one configuration for the antenna array by using the at least one coprime moduli set;

choosing, with the at least one processor, one of the at least one configuration for the antenna array to employ by evaluating a resultant gain and an unambiguous angle of arrival (AOA) for each of the at least one configuration; and determining, with the at least one processor, absolute spacing between pairs of the antenna elements of the antenna array for the chosen configuration for the antenna array according to a wavelength requirement for the antenna array, wherein the absolute spacing between each of the pairs of the antenna elements is a factor of $1/p_i$.

2. The method of claim 1, wherein the antenna array is a linear array.

3. The method of claim 1, wherein the antenna array is a planar array.

4. The method of claim 1, wherein the antenna elements are receive elements.

5. The method of claim 1, wherein the antenna elements are transmit elements.

6. The method of claim 1, wherein the antenna elements are transmit and receive elements.

7. The method of claim 1, wherein the absolute spacing between the antenna elements is equal to or greater than the wavelength requirement divided by two.

8. The method of claim 1, wherein the at least one coprime moduli set is determined by using a Chinese Remainder Theorem.

9. A system for forming an antenna array, the system comprising:
   the antenna array comprising a plurality of antenna elements; and
   at least one processor to determine at least one coprime moduli set $\{p_i\}$ based upon a differential phase gain requirement and a differential phase range requirement for the antenna array, to produce at least one configuration for the antenna array by using the at least one coprime moduli set, to choose one of the at least one configuration for the antenna array to employ by evaluating a resultant gain and an unambiguous angle of arrival (AOA) for each of the at least one configuration, and to determine absolute spacing between pairs of the antenna elements of the antenna array for the chosen configuration for the antenna array according to a wavelength requirement for the antenna array, wherein the absolute spacing between each of the pairs of the antenna elements is a factor of $1/p_i$.

10. The system of claim 9, wherein the antenna array is a linear array.

11. The system of claim 9, wherein the antenna array is a planar array.

12. The system of claim 9, wherein the antenna elements are receive elements.

13. The system of claim 9, wherein the antenna elements are transmit elements.

14. The system of claim 9, wherein the antenna elements are transmit and receive elements.

15. The system of claim 9, wherein the absolute spacing between the antenna elements is equal to or greater than the wavelength requirement divided by two.

16. The system of claim 9, wherein the at least one coprime moduli set is determined by using a Chinese Remainder Theorem.

17. An apparatus for forming an antenna array, the apparatus comprising:
   the antenna array comprising a plurality of antenna elements; and
   at least one processor to determine at least one coprime moduli set $\{p_i\}$ based upon a differential phase gain requirement and a differential phase range requirement for the antenna array, to produce at least one configuration for the antenna array by using the at least one coprime moduli set, to choose one of the at least one configuration for the antenna array to employ by evaluating a resultant gain and an unambiguous angle of arrival (AOA) for each of the at least one configuration, and to determine absolute spacing between pairs of the antenna elements of the antenna array for the chosen configuration for the antenna array according to a wavelength requirement for the antenna array, wherein the absolute spacing between each of the pairs of the antenna elements is a factor of $1/p_i$.

18. The apparatus of claim 17, wherein the antenna array is a linear array.

19. The apparatus of claim 17, wherein the antenna array is a planar array.

20. The apparatus of claim 17, wherein the absolute spacing between the antenna elements is equal to or greater than the wavelength requirement divided by two.

* * * * *